United States Patent
Kando et al.

(10) Patent No.: US 7,833,841 B2
(45) Date of Patent: Nov. 16, 2010

(54) SEMICONDUCTOR APPARATUS AND METHOD FOR MANUFACTURING THE SAME

(75) Inventors: Hidehiko Kando, Matsudo (JP); Isao Sakama, Hiratsuka (JP)

(73) Assignee: Hitachi, Ltd., Tokyo (JP)

( * ) Notice: Subject to any disclaimer, the term of this patent is extended or adjusted under 35 U.S.C. 154(b) by 275 days.

(21) Appl. No.: 12/187,601

(22) Filed: Aug. 7, 2008

(65) Prior Publication Data
US 2009/0159881 A1 Jun. 25, 2009

(30) Foreign Application Priority Data
Sep. 20, 2007 (JP) ............................. 2007-243552

(51) Int. Cl.
*H01L 21/82* (2006.01)
(52) U.S. Cl. ..................... 438/129; 438/22; 438/48; 438/128; 257/E21.613; 257/E21.645; 257/E21.657; 365/189.011; 365/189.16

(58) Field of Classification Search .................. 438/23, 438/55, 130; 257/E21.517, E21.532, E21.533, 257/E21.534, E21.613; 365/186
See application file for complete search history.

(56) References Cited
U.S. PATENT DOCUMENTS
7,295,467 B2 * 11/2007 Katayama et al. ...... 365/185.03
* cited by examiner

*Primary Examiner*—Charles D Garber
*Assistant Examiner*—Cheung Lee
(74) *Attorney, Agent, or Firm*—Brundidge & Stanger, P.C.

(57) ABSTRACT

The present invention is a method for manufacturing a semiconductor apparatus including a chip which is fabricated in large numbers on a wafer and has a plurality of information blocks. In the method, a unique information bit is written in a chip discrimination block of each chip within a shot, which is a segmented region of the wafer, by a fixed pattern method. In addition, an information bit uniquely given to each shot within the wafer is written by a mask shift method. Further, an information bit uniquely given to each wafer is written in a wafer discrimination block of the chip which is fabricated on the wafer by the mask shift method and mask combination method.

14 Claims, 7 Drawing Sheets

SEMICONDUCTOR APPARATUS AND METHOD FOR MANUFACTURING THE SAME

CROSS REFERENCE TO RELATED APPLICATIONS

This application claims the foreign priority benefit under Title 35, United States Code, §119(a)-(d) of Japanese Patent Application No. 2007-243552, filed on Sep. 20, 2007, the contents of which are hereby incorporated by reference.

BACKGROUND OF THE INVENTION

1. Field of the Invention

The present invention relates to a semiconductor apparatus and a method for manufacturing the semiconductor apparatus, which can easily verify a reliability of a written bit.

2. Description of Related Art

An RFID tag attached to an individual product to label the product is required to readably store a unique identifier for avoiding confusion with another RFID tag. Therefore, the identifier has been written in a semiconductor chip constituting the RFID tag using an electron beam direct writing apparatus (EB apparatus). In the method described above, since a bit is written by aligning an individual memory cell, a long time is required for writing one semiconductor chip, thereby, improvement of the productivity has been difficult. In addition, since the EB apparatus is expensive, reduction of the manufacturing cost has been difficult.

In the meantime, a "method for manufacturing semiconductor apparatus" which is used for obtaining a semiconductor chip having a different random number for each wafer by using the following processes has been disclosed in Japanese Patent Laid-open Publication No. 2005-347597 (paragraphs [0011], [0020], FIG. 1 to FIG. 4). In the method, first, (1) combine a plurality of reticles having a random number and an error detection code; next, (2) in the reticle, a large number of contact holes larger than that of intersection points between bit-lines and word-lines are disposed in an area larger than the area where the bit-lines and word-lines are formed; then, a relative position between the bit-lines and word-lines is displaced for each wafer with reference to an alignment mark. As a result, the semiconductor chip having a different random number for each wafer is obtained.

SUMMARY OF THE INVENTION

However, in the "method for manufacturing semiconductor apparatus" (Japanese Patent Laid-open Publication No. 2005-347597), as described in (1), if it is tried to prepare various kinds of random numbers only by combinations of the reticles, a large number of various kinds of reticles are required. Therefore, as described in (2), it is required to combine the method which displaces the relative position between the contact holes and intersection points of the bit-lines and word-lines. However, in the method (2), since the error detection code has a one-to-one correspondence with the random number, the method described above can not be combined to (1).

The present invention has been developed considering the above problems. It is, therefore, an object of the present invention to provide a semiconductor apparatus and a method for manufacturing the semiconductor apparatus, which can easily verify a written bit.

To solve the problems described above, the method for manufacturing a semiconductor apparatus according to the present invention provides a method which includes steps of: a chip discrimination block writing step for writing a first information bit which is uniquely given to each chip included in a shot in a first information block of the chip; a shot discrimination block writing step for writing a second information bit which is uniquely given to each shot in the wafer in a second information block of the chip; and a wafer discrimination block writing step for writing a third information bit which is uniquely given to each of the wafers in a third information block of the chip fabricated on the wafer.

In regard to specific methods of the present invention other than the above, spirits of the technology will be described through, for example, "DETAILED DESCRIPTION OF THE PREFERRED EMBODIMENT".

According to the present invention, a semiconductor apparatus and a method for manufacturing the semiconductor apparatus, which can easily verify a written bit, can be provided.

DETAILED DESCRIPTION OF THE PREFERRED EMBODIMENT

Next, one embodiment of the present invention will be explained in details by referring to figures.

Figure 1:
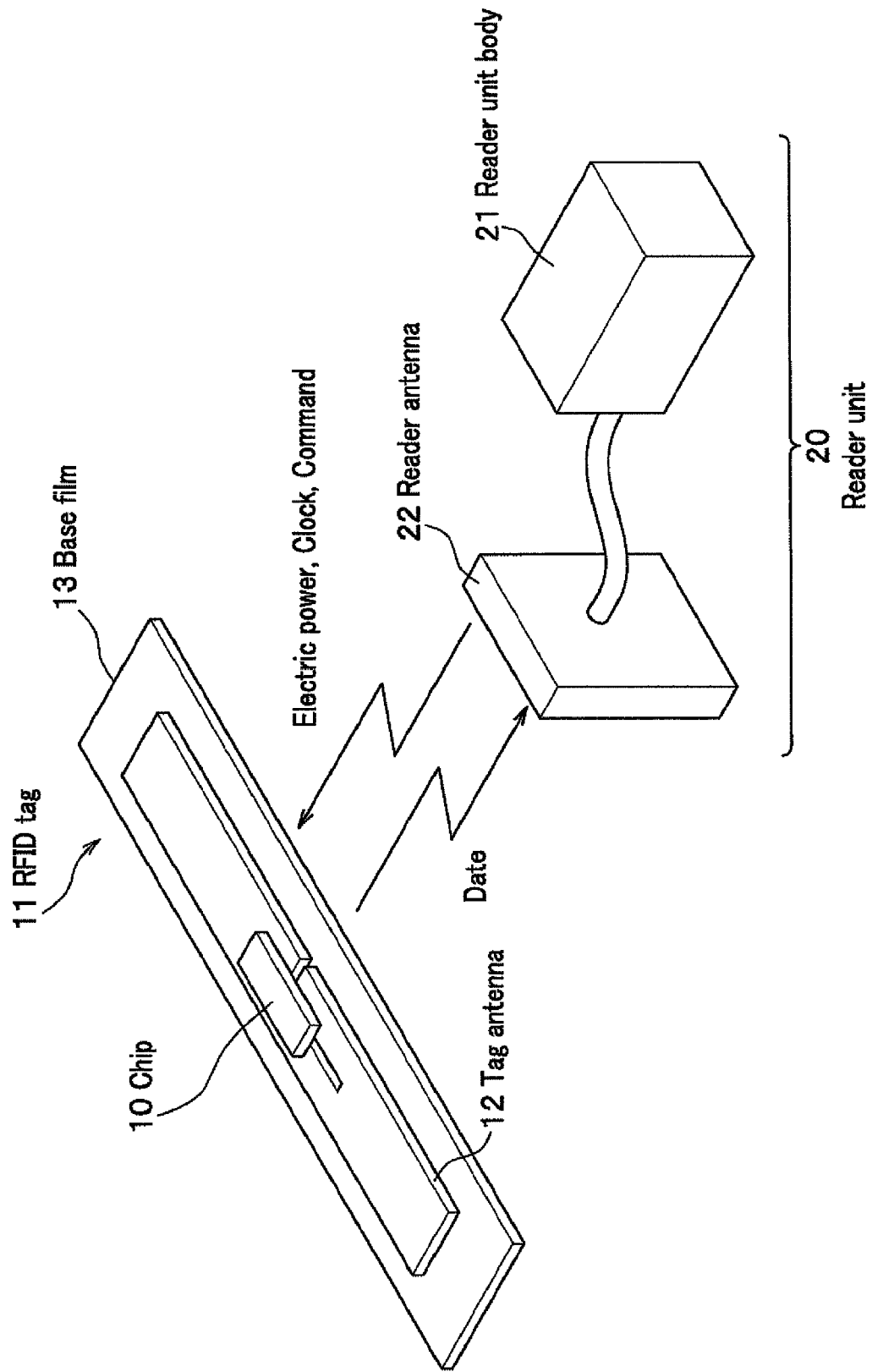
FIG. 1 is an illustration for explaining a utilization example of a chip according to one embodiment of the present invention.

FIG. 1 is an illustration for explaining a utilization example of a chip 10 according to one embodiment of the present invention.

An RFID tag 11 includes a base film 13 made of dielectric material such as polyimide, a tag antenna 12 formed on the base film 13 by an electrically conductive film such as aluminum or copper, and the chip 10 connected to power supply points of the tag antenna 12. The RFID tag 11 constituted as described above is called an inlet. In addition, the RFID tag 11 is a passive device which is activated by taking in an external electromagnetic energy.

The chip 10 is a semiconductor apparatus for an RFID, and includes, for example, a non-volatile storage function, a signal transmission/reception function, a signal modulation/demodulation function, a power extraction function from a received signal, and an arithmetic control function. The chip 10 is typically a one-chip IC integrating the functions described above like a μ-chip (registered trademark) which is manufactured by the assignee of the present invention.

It is noted that if simply written as "memory" in the explanation, the "memory" may mean a non-volatile storage area which is formed (written) during a semiconductor fabrication process of the chip 10.

A reader unit 20 includes a reader unit body 21 and a reader antenna 22 connected to the reader unit body 21.

The reader unit body 21 transmits a modulated questioning signal to the reader antenna 22 so that a power supply, a clock supply, and a command transmission can be implemented. The reader antenna 22 transforms the questioning signal into electromagnetic waves or electromagnetic fields to radiate the waves or fields in the air.

In addition, the reader antenna 22 receives an answering signal radiated from the RFID tag 11 and transforms the signal into a high frequency current to transmit to the reader unit body 21. The reader unit body 21 demodulates the high frequency current to take out data, and transmits the date to other units (not shown) and a display unit (not shown) for displaying a data list on the display unit.

In the tag antenna 12 of the RFID tag 11, a L-shaped slit is disposed to form a stub for impedance matching, and the chip 10 is connected to this area (stub side and opposite side of the stub across the slit) as the power supply points. With the configuration described above, a capacitance of the chip 10 is compensated by an inductance of the stub, and thereby, a side of the chip 10 and a side of the tag antenna 12 are impedance-matched. As a result, a signal loss of the transmission/reception can be reduced. In addition, the RFID tag 11 may use other devices having identical functions to those described above, for example, the chip 10 on which an antenna coil (not shown) is formed.

Figure 2:
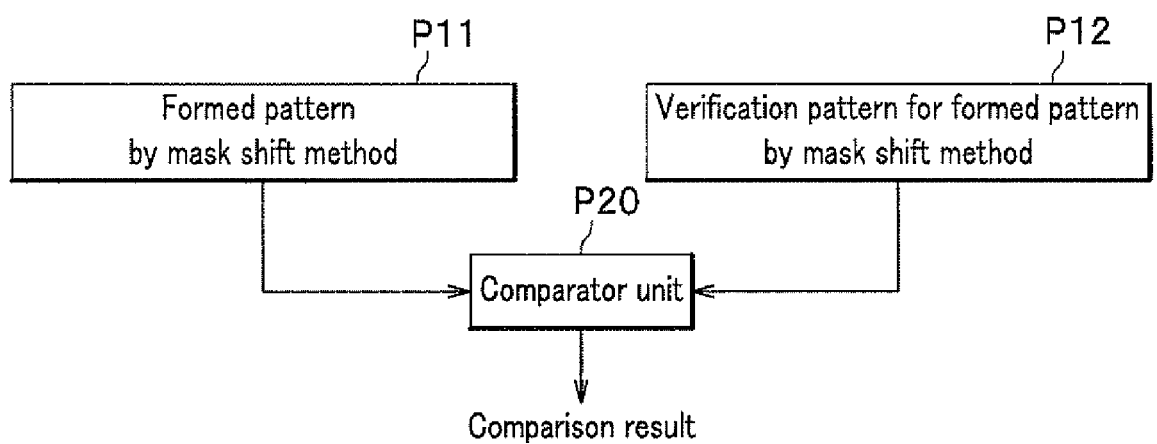
FIG. 2 is a conceptual illustration showing a verification principle of a storing content in a chip according to the present invention.

FIG. 2 is a conceptual illustration showing a verification principle of a storing content in the chip 10 according to the present invention.

A pattern of a non-volatile storage area of the chip 10 (see FIG. 1) is formed by combination of a "mask shift method", a "mask combination method" described later, and a "fixed pattern method". It is noted that a unit for conducting verification, which will be described later, is expressed as a comparator unit P20.

With respect to the "mask shift method", a "verification pattern P12 for formed pattern by mask shift method" is formed in the chip 10 (see FIG. 1) as well as a "formed pattern P11 by mask shift method". The "verification pattern P12 for formed pattern by mask shift method" is formed by a procedure identical to that of the "formed pattern P11 by mask shift method", and has the same pattern with the "formed pattern P11 by mask shift method". That is, if there is no error in each pattern (P11, P12), the same data can be obtained from the both patterns (P11, P12).

If a part of data obtained from each of the patterns (P11, P12) is not identical, it means that there is an error in one of the "formed pattern P11 by mask shift method" and the "verification pattern P12 for formed pattern by mask shift method". Since a probability that the error is in the "formed pattern P11 by mask shift method" is half, practically, the chip 10 corresponding to the error may be scrapped as a defective chip without checking which pattern (P11, P12) contain the error. In addition, a probability to generate an error when a pattern is formed is extremely small. Therefore, in a single chip 10, since a probability that a given portion in the "formed pattern P11 by mask shift method" and a portion corresponding to the given portion in the "verification pattern P12 for formed pattern by mask shift method" are both errors is expressed as a square value of the extremely small probability, practically, a undetected probability of the defective portion is negligible small.

Specifically, identical data strings are read out from the "formed pattern P11 by mask shift method" and the "verification pattern P12 for formed pattern by mask shift method", next, each of the read out data strings is compared each other, and the obtained comparison result is checked up. For example, address numbers of the two patterns (P11, P12) are read out in ascending order, and each data of the data strings corresponding to the identical address number (that is, in read out order) is conducted XOR (exclusive OR) operation to calculate a data string. If values of the data string are composed of only "0" (zero), it means that the chip 10 of this verification is good, and if the data string contains a value "1", it means that the chip 10 of this verification is a defective one.

Figure 3:
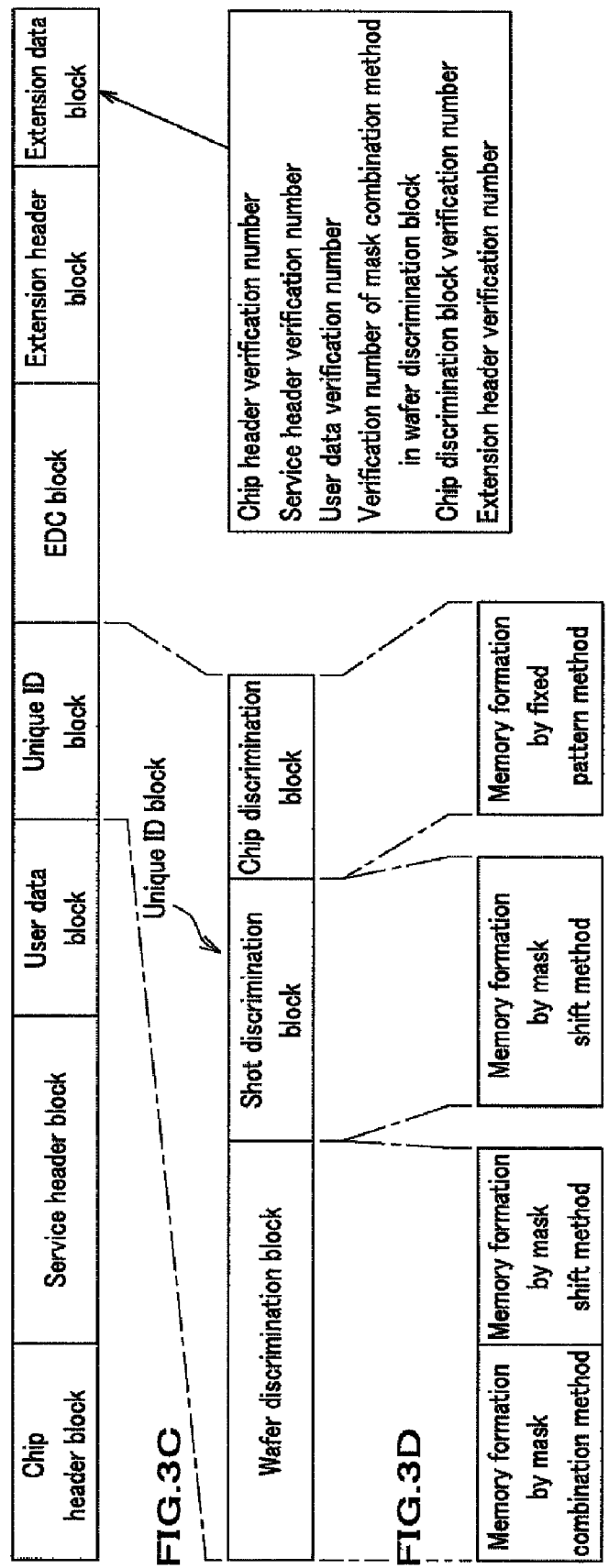
FIG. 3A to FIG. 3D are illustrations for explaining a data structure and a memory structure to be stored in a chip.

FIG. 3A to FIG. 3D are illustrations for explaining a data structure and a memory structure to be stored in a chip;

As shown in FIG. 3A, a data string stored in the chip 10 includes, in ascending order of the address number, a chip header composed of a header and an extension, a service header composed of a class identifier and a service ID, an application data composed of a user data and a unique ID, an error detection circuit output result (EDC), an extension header composed of a header and an extension, and an ID verification data.

The chip header indicates that the chip 10 is a predetermined type of RFID chip (for example, µ-chip (registered trademark)). The service header is determined by, for example, specifications of the chip 10. The application data is composed of the user data defining a user of the chip 10 and the unique data identifying each chip 10. The "error detection circuit output result" (EDC) is data generated from the chip header, the service header, and the application data for verifying the chip header, the service header, and the application data. The ID verification data is data for verification generated from data other than the ID verification data.

As shown in FIG. 3B, a memory block of the chip 10 includes, in ascending order of the address number and corresponding to the data string stored in the chip 10 shown in FIG. 3A, a chip header block storing the chip header, a service header block storing the service header, a user data block storing the user data in the application data, a unique ID block storing the unique ID, an EDC block storing the "error detection circuit output result" (EDC), an extension header block storing the extension header, and an extension data block storing the ID verification data.

The ID verification data to be stored in the extension data block includes (1) a chip header verification number, (2) a service header verification number, (3) a user data verification number, (4) a verification number of the mask combination method in a wafer discrimination block, (5) a chip discrimination block verification number, and (6) an extension header verification number. Each of these data described above is cross-checked with data, which is subjected to a predetermined processing, corresponding to each block, and as a result, the data stored in the each block can be verified whether the data is correct or not.

The unique ID is a unique identifier for a combination of a same chip header, a same service header, and a same user data, and given to each chip 10.

As shown in FIG. 3C, the unique ID block includes a wafer discrimination block which indicates a wafer from which the chip 10 is taken out, a shot discrimination block which indicates a shot with which the chip 10 is formed, and a chip discrimination block which indicates a location of the chip 10 in the shot.

As shown in FIG. 3D, the wafer discrimination block is composed of a memory formation area formed by the "mask combination method" and the memory formation area formed by the "mask shift method". The shot discrimination block is composed of the memory formation area formed by the "mask shift method". The chip discrimination block is composed of the memory formation area formed by the "fixed pattern method".

Alternately, the wafer discrimination block may be composed of the memory formation area formed by the "mask shift method" without using the "mask combination method".

It is noted that the "mask combination method" is a method for forming different memory patterns on the chip 10 by combining different masks (reticles). In the method, more masks are required for increasing the different memory patterns.

The "mask shift method" is a method for obtaining different memory patterns by changing a relative position between the chip 10 (surface) and the mask by the pitch of a bit-line or a word-line (both not shown) of the memory as a unit. The "mask shift method" will be described later in details by referring to FIG. 6A and FIG. 6B.

The "fixed pattern method" is a method for forming a memory pattern by arranging an original master on which a pattern image is formed at slightly above a wafer or on the wafer for exposure. Since the pattern image is different in each portion corresponding to the chip 10, the chip 10 which is obtained from an area formed by the "fixed pattern method" in the same wafer has a unique pattern in the wafer.

Figure 4:
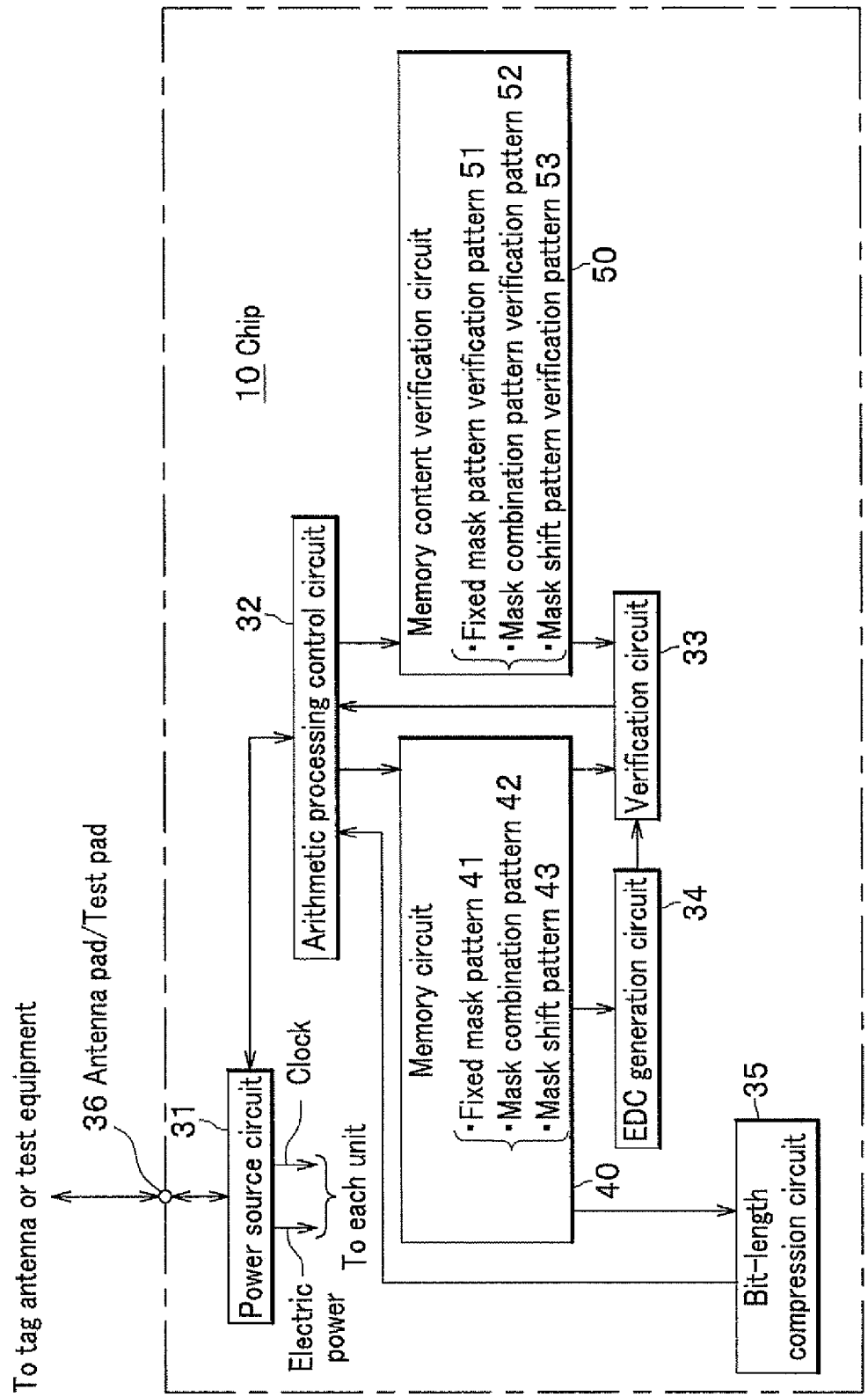
FIG. 4 is a block diagram of hardware of a chip showing units related to a read only memory.

FIG. 4 is a block diagram of hardware of a chip 10 showing units related to a read only memory.

The chip 10 includes a power source circuit 31, an arithmetic processing control circuit 32, a memory circuit 40, a memory content verification circuit 50, an EDC generation circuit 34, a verification circuit 33, and a bit-length compression circuit 35.

The chip 10 is connected to the tag antenna 12 (see FIG. 1) which is located outside the chip 10 through an antenna pad 36 disposed in the package of the chip 10. When the chip 10 is tested without using the tag antenna 12, the antenna pad 36 functions as a test pad, and a test equipment (not shown) is connected to the test pad (antenna pad 36) instead of the tag antenna 12. Since the chip 10 according to the present embodiment has a memory verification mechanism, a memory test and a communication test can be concurrently conducted (partial overlapping of time of the both tests may be sufficient) by connecting the tag antenna 12 to the antenna pad 36, and each test result of the memory test and the communication test can be obtained separately. Of course, the following processes may be taken. First, the memory test of the chip 10 is conducted by connecting a test equipment to the test pad (antenna pad 36), and subsequently the communication test is conducted by connecting the tag antenna 12 to the antenna pad 36.

The power source circuit 31 extracts an electric power and a clock from a high frequency current (questioning signal) transmitted from the tag antenna 12 to supply to each part of the chip 10. The power source circuit 31 also has a modulation/demodulation function and transmits a data signal, which is input from the antenna pad 36, to the arithmetic processing control circuit 32 after demodulating the data signal, and also transmits a data signal received from the arithmetic processing control circuit 32 to the outside through the antenna pad 36 after modulating the data signal.

The arithmetic processing control circuit 32 is a microcomputer, and controls operations of each unit as well as conducts various kinds of processing in the chip 10, and further, has a function to intermediate between the data transmission and data reception.

The memory circuit 40 includes a fixed mask pattern 41 formed by the "fixed mask method", a mask combination pattern 42 formed by the "mask combination method", and a mask shift pattern 43 formed by the "mask shift method".

The memory content verification circuit 50 includes a fixed mask pattern verification pattern 51 formed by the "fixed mask method", a mask combination pattern verification pattern 52 formed by the "mask combination method", and a mask shift pattern verification pattern 53 formed by the "mask shift method".

If there is no error, the fixed mask pattern 41 is identical to the fixed mask pattern verification pattern 51, the mask combination pattern 42 is identical to the mask combination pattern verification pattern 52, and the mask shift pattern 43 is identical to the mask shift pattern verification pattern 53. Therefore, if there is no error, patterns in the memory circuit 40 are identical to those in the memory content verification circuit 50.

The verification circuit 33 reads out data one by one (for example, by one-bit) in a predetermined order (for example, in ascending order of address number) from the memory circuit 40 and the memory content verification circuit 50 based on a control of the arithmetic processing control circuit 32 and conducts, for example, XOR operation to verify the identity of the both data, then, outputs the verification result to the arithmetic processing control circuit 32.

The EDC generation circuit 34 reads out data from the memory circuit 40 and generate an EDC to transmit to the verification circuit 33.

The verification circuit 33 compares the EDC generated by the EDC generation circuit 34 with an EDC which is read out from the memory circuit 40, and transmits the verification result to the arithmetic processing control circuit 32.

The bit-length compression circuit 35 compresses data readout from the memory circuit 40 and transmits the compressed data to the arithmetic processing control circuit 32. This is a process for compressing a redundancy of the mask shift pattern 43 since the mask shift pattern 43 especially has a redundant structure. Since on-chip data compression is adopted, a communication error probability of the communication through the tag antenna 12 can be reduced, and also, a communication load and a communication time can be reduced. Further, the read out data can be treated as a compact random number.

The arithmetic processing control circuit 32 transmits the data (information), which is obtained as described above, outside the chip 10 through the power source circuit 31.

The arithmetic processing control circuit 32 also transmits the data outside the chip 10 by adding an error detection result received from the verification circuit 33. However, when there is an inconsistency in the documented content of the "mask combination method" or the "mask shift method", the arithmetic processing control circuit 32 transmits an occurrence of error of the memory content in the chip 10 outside the chip 10 by making a part or all of the verification result generated by the verification circuit 33 in a specific pattern (form) which is easily distinguished from other data. Through this, when the RFID tag 11 is read by the reader unit 20 (see FIG. 11), an error in a reading operation by a wireless communication can be discriminated from a defect of the memory in the chip 10. This is a big advantage for implementing a quality assurance of a product.

Figure 5:
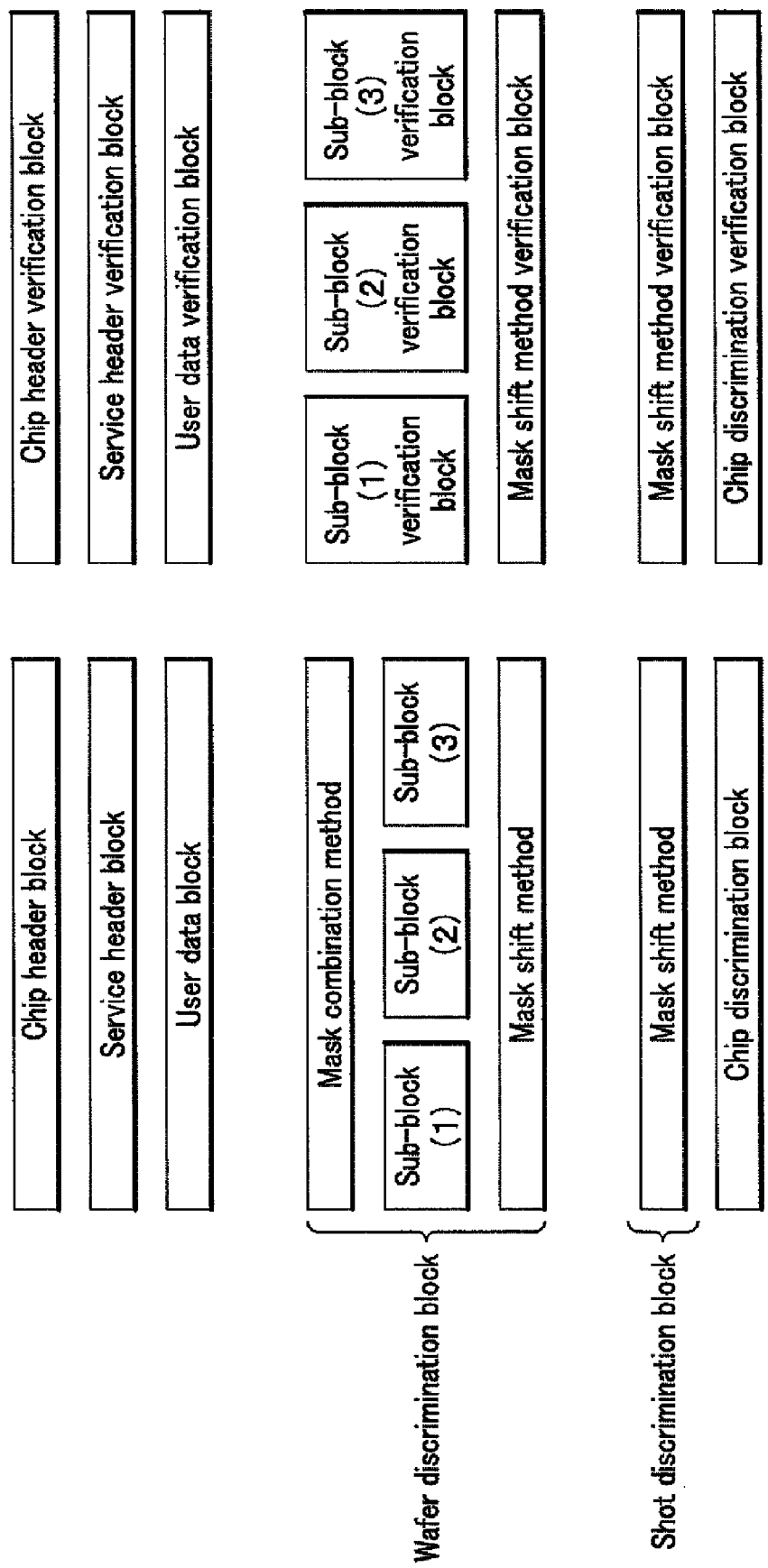
FIG. 5 is an illustration showing a layout of a memory.

FIG. 5 is an illustration showing a layout of a memory.

In the illustration, each element on the left is a block in the memory body and each element on the right is a verification block for verifying the memory.

The block on the left and the block on the right corresponding to the block on the left are fabricated with the same processes.

Therefore, each block on the left and each block on the right have patterns which have one-to-one correspondence to each other.

Figure 6A:
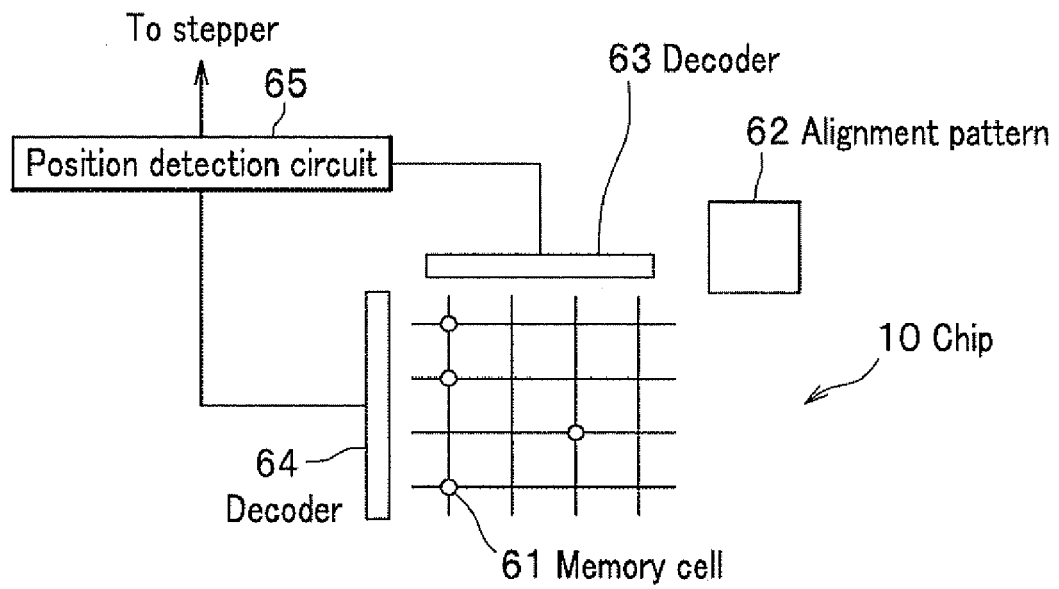
FIG. 6A and FIG. 6B are illustrations for explaining a pattern formation example by a mask shift method in details.
Figure 6B:
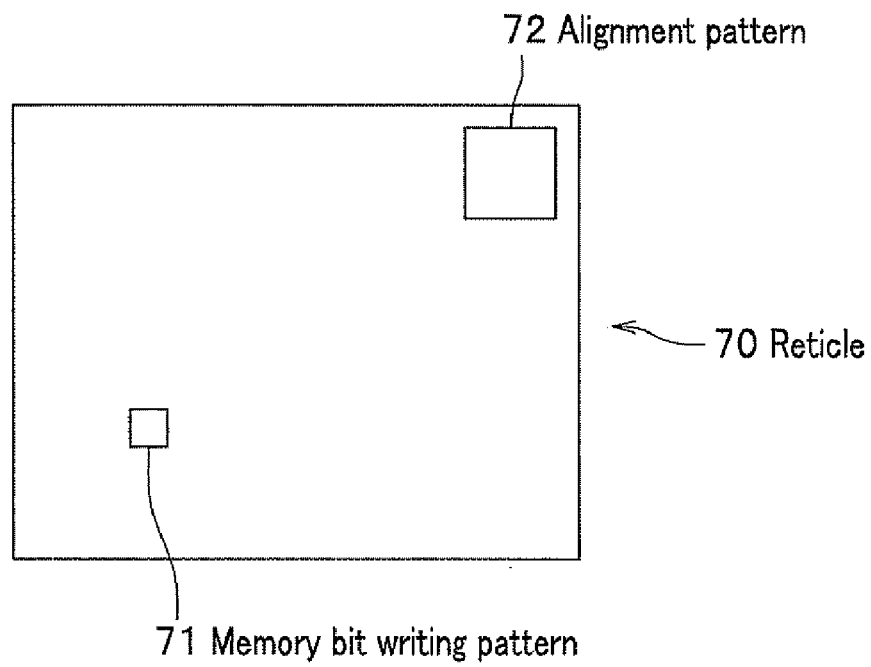

FIG. 6A and FIG. 6B are illustrations for explaining a pattern formation example by a mask shift method in details.

The illustrations show a writing example of a predetermined bit-string in the chip 10 which has a 16-bits (4-bits×4-bits) memory capacity.

As shown in FIG. 6A, a memory cell 61 and an alignment pattern 62 are formed in the chip 10.

In addition, as shown in FIG. 6B, in a reticle 70, a memory bit writing pattern 71 is bored and an alignment pattern 72 is formed.

The memory cell 61 is written as follows. The reticle 70 is set slightly above the chip 10. Decoders 63, 64 read a relative displacement between the alignment patterns 62 and 72, while referring to a relative position between the alignment patterns 62 and 72. A stepper receives the position information from a position detection circuit 65. Then, a target memory cell 61 is exposed through the memory bit writing pattern 71.

In the present embodiment, a number of the memory bit writing pattern 71 is small, for example, one to several, and an area where the memory cell 61 is formed is made relatively large. Through this, an exposure light for the memory bit writing pattern 71 is used for exposing the memory cell 61 without wasting the light by leaking outside the target area. Therefore, a verification of a memory formation by the "mask shift method" can be conducted using, for example, the chip discrimination block verification number (see FIG. 3B).

It is noted that in the feature described above, data becomes redundant. However, the data can be utilized with a compact form by using the data processed by the bit-length compression circuit 35 (see FIG. 4).

In addition, it is noted that in a "chip discrimination block writing process", content of a memory is written by the "fixed pattern method". Similarly, in a "shot discrimination block writing process", content of a memory is written by the "mask shift method". Also, in a "wafer discrimination block writing process", content of a memory is written by the "mask shift method" (or by "mask shift method" and "fixed pattern method").

Figure 7:
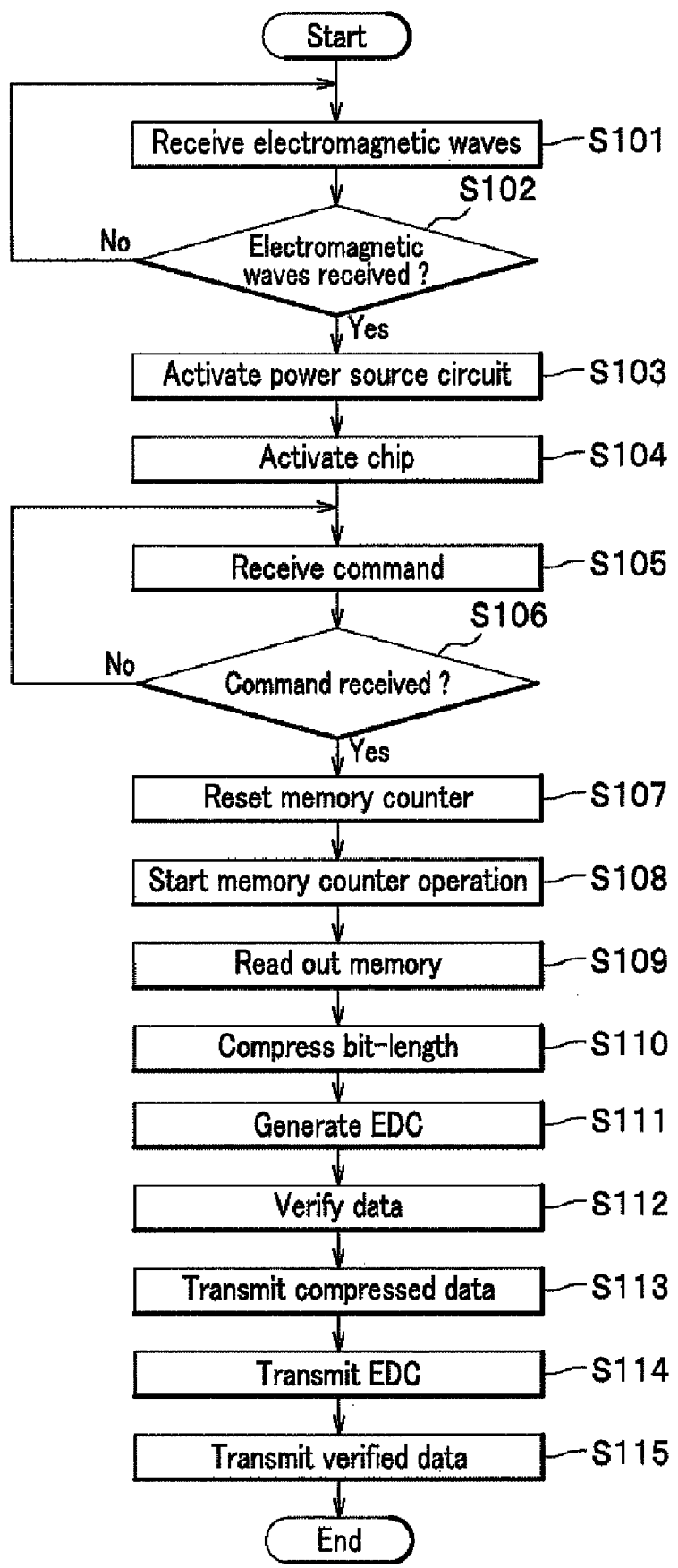
FIG. 7 is a flowchart showing a verifying operation example of a memory in a chip 10.

FIG. 7 is a flowchart showing a verifying operation example of a memory in a chip 10 (see FIG. 1 and FIG. 4 as appropriate).

First, the power source circuit 31 receives electromagnetic waves through the tag antenna 12 (Step S101).

If there is no reception of the electromagnetic waves (Step S102: No), the step returns to Step S101 and continuously receives the electromagnetic waves.

If the electromagnetic waves are received (Step S102: Yes), the power source circuit 31 is activated (Step S103) and an electric power and a clock are supplied to each unit in the chip 10.

Then, a whole chip 10 is activated (Step S104).

Subsequently, the arithmetic processing control circuit 32 receives a command through the power source circuit 31 (Step S105).

If there is no reception of the command (Step S106: No), the step returns to Step S105 and continuously receives the command.

If the command is received (Step S106: Yes), the arithmetic processing control circuit 32 resets (Step S107) a built-in memory counter (not shown), and the memory counter starts operation (Step S108).

Next, the bit-length compression circuit 35, the EDC generation circuit 34, and the verification circuit 33 read out data of the memory (Step S109).

Then, the bit-length compression circuit 35 conducts a bit-length compression (Step S110) of the data read out from the memory circuit 40 and transmits the compressed data to the arithmetic processing control circuit 32.

In addition, the EDC generation circuit 34 generates an EDC (Step S111) by using data read out from the memory circuit 40, and transmits the generated EDC to the verification circuit 33.

The verification circuit 33 conducts a data verification (Step S112) based on the received EDC, and transmits data (verified data) showing the verification result to the arithmetic processing control circuit 32.

The arithmetic processing control circuit 32 transmits data, which is compressed by the bit-length compression circuit 35, outside the chip 10 through the power source circuit 31 (Step S113).

The arithmetic processing control circuit 32 also transmits the EDC, which is generated by the EDC generation circuit 34, outside the chip 10 through the power source circuit 31 (Step S114).

The arithmetic processing control circuit 32 further transmits the verified data, which is generated by the verification circuit 33, outside the chip 10 through the power source circuit 31 (Step S115).

When a series of the processing is completed, the step returns to the first step and repeats the processing again.

Other than the chip 10 for the RFID tag, the present embodiment described above is widely applicable for verifying whether a unique data stored in a device to be identified is correct or not, while discriminating a reason of an error from others, and for keeping a reliability of stored data to be high.

What is claimed is:

1. A method for manufacturing a semiconductor apparatus comprising a chip which is fabricated in large numbers on a wafer and has a plurality of information blocks, the method comprising steps of:
   a chip discrimination block writing step for writing a first information bit which is uniquely given to each chip included in a shot, which is a segmented region of the wafer, in a first information block of the chip;
   a shot discrimination block writing step for writing a second information bit which is uniquely given to each shot in the wafer in a second information block of the chip; and
   a wafer discrimination block writing step for writing a third information bit which is uniquely given to each of the wafers in a third information block of the chip fabricated on the wafer.

2. The method for manufacturing a semiconductor apparatus according to claim 1,
   wherein in the chip discrimination block writing step, the writing is conducted using an identical reticle for all shots in the wafer.

3. The method for manufacturing a semiconductor apparatus according to claim 2, further comprising:
   a first error detection information writing step for writing error detection information generated from the first information bit in a fourth information block of the chip as first error detection information.

4. The method for manufacturing a semiconductor apparatus according to claim 1,
   wherein in the shot discrimination block writing step, the writing is conducted by controlling a relative position between a reticle and the wafer.

5. The method for manufacturing a semiconductor apparatus according to claim 4, further comprising:
a second error detection information writing step for writing a fourth information bit which is identical to the second information bit in a fifth information block of the chip as second error detection information.

6. A semiconductor apparatus which is manufactured according to claim 5, comprising:
a first error detection circuit for detecting a bit error by comparing the second information bit with the second error detection information by each bit.

7. The semiconductor apparatus according to claim 6, comprising:
an error signal transmission circuit which transmits an error signal informing an occurrence of the bit error when the bit error is detected.

8. A semiconductor apparatus which is manufactured according to claim 4, comprising:
a first compression circuit for compressing a bit of the third information bit.

9. The method for manufacturing a semiconductor apparatus according to claim 1,
wherein in the wafer discrimination block writing step, the writing is conducted by controlling a relative position between a reticle and the wafer.

10. The method for manufacturing a semiconductor apparatus according to claim 9, further comprising:
a third error detection information writing step for writing a fifth information bit which is identical to the third information bit in a sixth information block of the chip as third error detection information.

11. A semiconductor apparatus which is manufactured according to claim 10, comprising:
a second error detection circuit for detecting a bit error by comparing the third information bit with the third error detection information by each bit.

12. The method for manufacturing a semiconductor apparatus according to claim 9,
wherein the reticle is specified for each of the wafers.

13. A semiconductor apparatus which is manufactured according to claim 9, comprising:
a second compression circuit for compressing a bit of the third information bit.

14. The method for manufacturing a semiconductor apparatus according to claim 1,
wherein in one part of the wafer discrimination block writing step, the writing is conducted by controlling a relative position between a reticle and the wafer, and in the other part of the wafer discrimination block writing step, the writing is conducted using a reticle which is specified for each of the wafers.

* * * * *